United States Patent [19]

Falk

[11] 4,017,696
[45] Apr. 12, 1977

[54] INITIALIZING CIRCUIT

[75] Inventor: Robert James Falk, Columbus, Ohio

[73] Assignee: Bell Telephone Laboratories, Incorporated, Murray Hill, N.J.

[22] Filed: Dec. 31, 1975

[21] Appl. No.: 645,655

[52] U.S. Cl. .......................... 179/175; 179/18 AB; 339/17 R
[51] Int. Cl.² .......................................... H04M 3/22
[58] Field of Search ....... 179/175, 175.2 R, 18 AB, 179/1 PC; 339/17 R, 17 A, 17 B

[56] References Cited

UNITED STATES PATENTS

| 3,061,691 | 10/1962 | Semon | 179/175.1 R |
|---|---|---|---|
| 3,315,217 | 4/1967 | Bird | 339/17 R |
| 3,350,515 | 10/1967 | Semon | 179/175.1 R |
| 3,875,351 | 4/1975 | Kennedy | 179/18 AB |

Primary Examiner—Douglas W. Olms
Attorney, Agent, or Firm—Frederick W. Padden

[57] ABSTRACT

Initializing apparatus for use with circuitry mounted on a plug-in printed circuit board is described. Illustratively a telephone make-busy circuit is disclosed, which circuit automatically operates a make-busy relay on a plug-in telephone circuit when that circuit is plugged into a connector. A special "half" contact on the printed circuit board is connected to the control lead for the relay and when the circuit board is inserted into the connector, ground is momentarily applied to the contact and the relay control lead by a contact finger in the connector. The momentary ground causes the make-busy relay to operate for making the circuit appear busy to the telephone switching system. When the circuit board is fully inserted into the connector, the connector contact finger moves off the special contact on the circuit board and thereby removes the temporary ground. However, the relay remains operated by means of a circuit involving its own contacts for maintaining the circuit busy under control of a maintenance and test desk.

10 Claims, 3 Drawing Figures

INITIALIZING CIRCUIT

FIELD OF THE INVENTION

This invention relates to printed circuit board connector arrangements and in particular to connector contact sequencing arrangements for applying predetermined patterns of signals to printed circuit boards.

BACKGROUND OF THE INVENTION

The use of printed circuit boards to mount electronic circuitry has grown tremendously in the recent past due to the ease of manufacture and the convenient characteristics which such boards offer. In particular, printed circuit boards may be equipped with conductor patterns which allow the board to be plugged directly into a suitable connector. Plug-in circuit boards may be easily removed for repair and maintenance and then replaced without disturbing the rest of the equipment. Thus, printed circuit boards are particularly suited for applications such as telephone switching systems where it is not practicable to shut down an entire system when only a small portion of the circuitry must be removed for maintenance and repair.

Frequently, circuitry on a printed circuit board which has been unplugged must be placed into an initial state to avoid damaging the circuitry when the board is reinserted into a system that is in operation. It may also be desirable in some cases to initially place the circuitry in a "hold" or "busy" state when it is reinserted into an operational system so that the circuitry may be placed in active service under control of automatic equipment or from a central location. For example, trunk circuitry for use in telephone switching systems often incorporates a relay known as a make-busy or lockout relay. The lockout relay, when operated, is used to make the trunk appear busy to a switching machine when either a malfunction occurs in the trunk circuitry or the trunk is to be removed from service for maintenance purposes. When the trunk is in the busy state it cannot be used by the switching equipment, and faulty operation is thereby avoided. The lockout relay typically has a winding connected to a maintenance desk of the system and is operated by placing a momentary current pulse on a relay control lead that is connected to the maintenance desk. In operating, the lockout relay locks operated over a circuit involving its own normally open contact. The operated lockout relay applies an appropriate battery or ground signal to a supervision lead for making the trunk circuit appear busy to any incoming calls.

Some trunk circuits are mounted on printed circuit boards that are operationally plugged into connectors mounted on the trunk frame of a switching system. When such a trunk circuit is removed from its connector after being placed in the busy state (with the corresponding lockout relay operated), the lockout relay, of course, releases since battery and ground are removed from the circuit when it is unplugged from the connector. After repairs or maintenance operations have been performed on the circuit and the circuit is reinserted into the frame connector, it is desirable that the lockout relay be reoperated in order to make the trunk appear busy. Appropriate tests may then be made by maintenance personnel before the trunk is placed back into service. The relay does not reoperate automatically since the signals which originally operated it are no longer present. One method which has been used to operate the relay is to simply manually push the relay armature, thereby causing the relay to operate and lock operated. However, a problem has arisen in many miniaturized trunk circuits, because the relay cannot be physically accessed. Thus it is desirable in this type of circuit to arrange for initialization of the circuitry when the circuit board is plugged into the connector. It is also desirable that the circuitry on the circuit board be under control of the maintenance desk after the board is plugged into the connector and that the initialization apparatus have no further effect on circuit operation.

SUMMARY OF THE INVENTION

The foregoing problem is solved and other objects are achieved in accordance with the principles of the present invention in one illustrative embodiment thereof wherein apparatus is provided to automatically initialize circuitry mounted on a printed circuit board when the circuit board is pushed into its corresponding connector. In particular, a special "half-contact" is provided on the circuit board to produce a momentary contact with a connector contact finger as the circuit board is inserted into the connector. When the circuit board is initially inserted into the connector, a connector finger makes contact with the special contact. As the board is further pushed into the connector, the connector finger slides off the half-contact, removing contact with the connector finger. The momentary contact is used to place the associated circuitry into an initial state.

It is a feature of the present invention that the special half-contact comprises a generally L-shaped conductive strip having one leg parallel to the edge of the circuit board which is inserted into the connector.

According to one aspect of the illustrative embodiment the momentary contact between the connector finger and the half-contact is used to generate a voltage pulse by connecting the connector finger to a source of initializing voltage. The voltage pulse produced is then used to change the state of a bistable device which initializes the circuitry.

According to another aspect of the illustrative embodiment the connector finger is connected to ground and the ground pulse which results from pushing the circuit board into the connector is used to operate an initializing relay which is then held operated by other apparatus.

According to yet another aspect of the illustrative embodiment, the relay is used to operate signaling apparatus which indicates that the circuitry is in a "busy" state.

It is another feature of the illustrative embodiment that apparatus comprising two connector fingers which mechanically contact each other when the circuit board is removed from its connector is used to indicate on a status lead that the circuitry is "busy" when the circuit board is removed from its connector.

According to a further aspect of the illustrative embodiment a telephone circuit mounted on a plug-in circuit board and having a lockout relay for controlling the busy/idle status of the circuit is equipped with a special contact which contact engages a finger attached to a potential source in a connector. When the board is plugged into the connector the lockout relay is operated by a temporary connection between the contact and the finger.

In a further feature of the illustrative embodiment, the relay in the telephone circuit has a normally-open contact and the relay winding is connected through the contact to a ground potential source so that the relay, once operated, is held operated by its own contacts.

DETAILED DESCRIPTION

Figure 1:
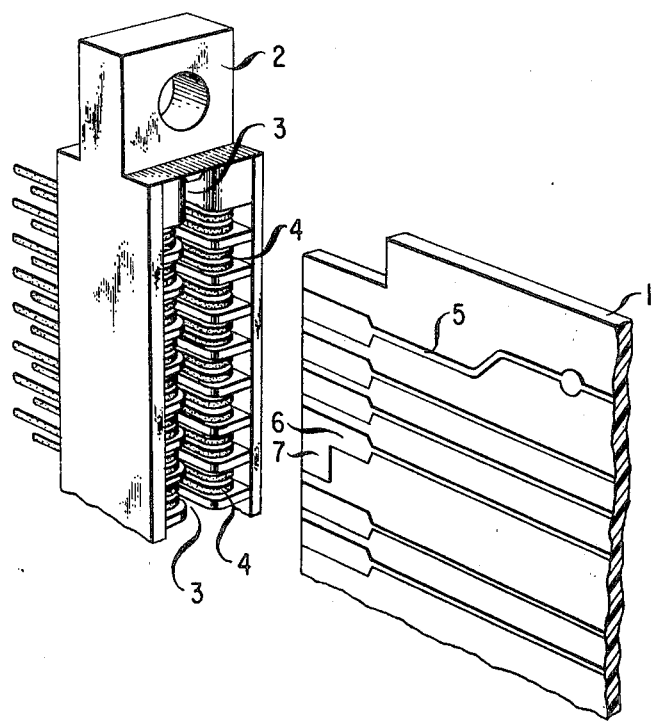
FIG. 1 shows the physical layout of a connector and a printed circuit board, including the special half-contact.

FIG. 1 of the drawing shows a connector 2 which may be connected to electrical circuit (not shown) as part of an electronic system. A printed circuit board 1 can be inserted into connector 2 to connect the circuitry on the board to the rest of the electrical circuit. Connector 2 and board 1 may illustratively be used in a telephone switching system to mount and connect trunk and line circuits to the switching system. When used in a telephone switching system, connector 2 is generally mounted on a rack (not shown) which in turn is mounted on a large stationary frame which may contain other circuitry for use with the switching system. Connector 2 has a slot 3 for receiving printed circuit board 1 and also has a plurality of fingers 4 which make electrical contact with contacts such as contacts 5 and 6 that are etched on board 1. Advantageously, a half-contact 7 is connected to normal contact 6 on printed circuit board 1, for initializing circuitry on board 1 as will be hereinafter explained.

Figure 2:
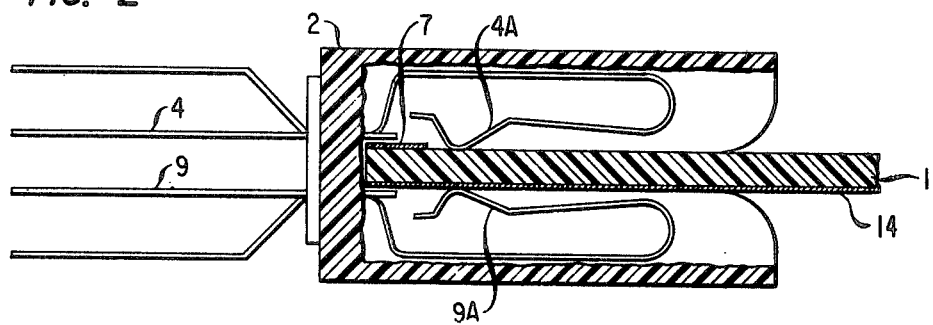
FIG. 2 is a cross-sectional view of the connector with the printed circuit board inserted.

FIG. 2 shows that contact finger 8 has a protrusion 8A which makes contact with the conductive portions of board 1 when board 1 is pushed into slot 3. Similarly, contact finger 17 has a protrusion 17A. Fingers 8 and 17 are physically positioned so that only protrusions 8A and 17A contact conductive sections on board 1. Half-contact 7 is arranged so that protrusion 8A of contact finger 8 first makes contact with contact 7 as board 1 is partially inserted into connector 2. When board 1 is fully inserted into connector 2, however, conductive section 7 slides past protrusion 8A breaking electrical contact with contact finger 8. The final position of contact 7 is shown in FIG. 2 after contact 7 has moved past protrusion 8A on finger 8 and board 1 is fully inserted into connector 2. Note, however, that contact 14, which is a normal contact, contacts protrusion 17A as board 1 is initially inserted into connector 2 and remains connected to contact protrusion 17A even when board 1 is inserted fully into place. Therefore, contact 7 makes a momentary contact with finger 8 only as the circuit board 1 is being pushed into connector 2, while normal contacts such as contacts 5, 6 and 14 make a continuing contact when board 1 is being pushed into connector 2.

Contact fingers 8 and 17 are normally arranged so that they do not touch when circuit board 1 is removed from connector 2. However, contact fingers 8 and 17 may be bent so that protrusions 8A and 17A contact each other to provide an electrical circuit closure if board 1 is withdrawn. Such an arrangement is useful for providing a circuit closure which is opened when board 1 is inserted into connector 2 as will be hereinafter explained.

Figure 3:
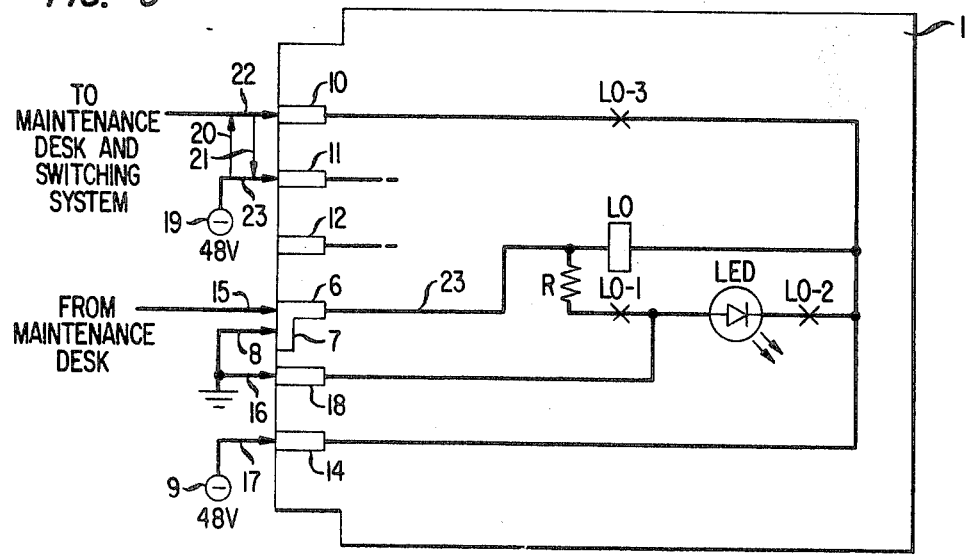
FIG. 3 is a schematic diagram of an illustrative electrical circuit utilizing the principles of the invention.

FIG. 3 shows an electrical schematic diagram of an illustrative telephone circuit which incorporates make-busy circuitry according to the principles of this invention. The components of the telephone circuit including lockout relay LO, its associated contacts, resistor R, and light-emitting diode LED are mounted on printed circuit board 1 which is schematically shown in FIG. 3. Relay LO and the associated circuitry are connected to the switching system via contacts 6, 7, 10–12, 14, and 18 shown at the left side of board 1 and frame connector fingers 8, 15–17, and 20–23 which are schematically shown as arrows at the left side of FIG. 3.

Assuming that board 1 is fully inserted into connector 2, battery is applied from source 9 in the switching system through connector finger 17 to contact 14 and one side of the relay winding LO. The other side of the relay winding LO is connected via contact 6 and frame connector finger 15 to the maintenance desk in the switching system. This connection allows the lockout relay LO to be operated under control of the maintenance desk. Note that finger 8 does not contact special contact 7 since board 1 is fully pushed into connector 2. In addition, another winding of relay LO (not shown) may be connected to the tip and ring leads (not shown) of the telephone circuitry so that the relay may be operated via a simplex circuit over the tip and ring leads from the maintenance desk. Assume for the purposes of illustration that the circuit is to be made busy for maintenance or repair purposes. In order to make the circuit busy, the maintenance desk places a temporary ground signal on frame connector 15, which ground is applied to the winding of relay LO via contact 6 and lead 24 and causes relay LO to operate over the circuit to battery previously described. Relay LO, when operated, closes contact LO-1, which in turn closes a circuit consisting of ground, frame connector finger 16, contact 18, contact LO-1, resistor R, the winding of relay LO, contact 14, and frame connector finger 17 to battery 9. This circuit holds relay LO operated when ground is removed by the maintenance desk from finger 15. Operated relay LO also closes contacts LO-2 and LO-3. Contact LO-2 connects battery to light-emitting diode LED causing light-emitting diode LED to be illuminated by means of an obvious circuit. Lighted diode LED indicates that the trunk circuit is in the busy condition. Operated relay LO further operates contact LO-3, causing battery to be connected to connector finger 22 via the circuit consisting of battery source 9, finger 17, contact 14, contact LO-3, contact 10, and finger 22. Battery on finger 22 indicates to the maintenance desk and switching system that the circuit is in the busy state. When the circuit is now unplugged for maintenance purposes, battery and ground are removed from contacts 14 and 18, respectively, therefore relay LO releases. However, as board 1 is withdrawn from connector 2, contact fingers 22 and 23 which are opposing fingers in connector 2 make contact, connecting battery source 19 to finger 22. This contact is denoted schematically by means of arrows 20 and 21. This battery signal causes a busy indication to be forwarded to the maintenance desk and the switching system indicating that the circuit remains out-of-service.

After repairs or maintenance services have been performed on the circuit, it must be reinserted into frame connector 2 in order to place it in service. When trunk circuit board 1 is inserted into connector 2, fingers 15, 16, 17 make contact with contacts 6, 18, and 14, as before, applying battery and ground to the trunk circuit and connecting relay control lead 24 to the maintenance desk via finger 15 as previously mentioned. However, when board 1 is initially inserted into connector 2, finger 8, which is grounded, makes contact to half-contact 7. As previously described, when circuit board 1 is pushed fully into connector 2, finger 8 slides past contact 7, removing the ground. Thus, a momentary ground is applied to relay control lead 24 as circuit board 1 is pushed into connector 2. This momentary ground on lead 24 causes relay LO to operate and lock operated over circuits previously described, thus placing trunk circuit 1 in the busy state. Furthermore, as board 1 is pushed into connector 2, fingers 22 and 23 are separated and battery source 19 is disconnected from finger 22, returning busy/idle control of the circuit to relay LO via contact LO-3.

After appropriate tests have been performed, maintenance personnel at the maintenance desk may place the circuit back into service by momentarily applying battery to connector finger 15. Since battery is applied to both sides of the winding of relay LO, it releases. The circuit thus reverts to the idle state and may now be used by the switching system.

Although the illustrative embodiment discloses a specific use of the invention in make-busy apparatus for a telephone circuit, it should be immediately clear to those skilled in the art that the principles of the invention extend to other types of electronic circuits, such as computer circuits. For example, although the illustrative embodiment shows a relay circuit the invention may be used with electronic circuitry such as flip-flops. Furthermore, various combinations of special half-contacts may be utilized to establish a sequence of initializing voltages or other initial conditions.

What is claimed is:

1. An initialization circuit for circuitry mounted on a printed circuit board having a sheet of insulating material and a plurality of conductive strips mounted flat on each side thereof, said strips being oriented perpendicular to one edge of said sheet, said one edge being adapted for insertion into a connector having a plurality of contact fingers for contacting said strips to establish electrical connection thereto, said circuit comprising, a conductive contact comprising a generally L-shaped conductive strip mounted flat on one side of said sheet and having one leg of said L-shaped strip parallel to said one edge, said contact slidably engaging one of said plurality of fingers when said board is partially inserted into said connector and said contact sliding past said one finger and breaking contact with said finger when said board is fully inserted into said connector whereby a momentary connection between said one finger and said contact is established to initialize said circuitry when said board is inserted into said connector.

2. An initialization circuit according to claim 1 wherein said connector fingers electrically contact said conductive strips at a predetermined distance from said one edge when said board is fully inserted into said connector and wherein the width of said one leg of said L-shaped conductive strip is less than said predetermined distance for disconnecting said L-shaped conductive strip from said one finger when said board is fully inserted into said connector.

3. Apparatus for placing circuitry mounted on a plug-in circuit board into an initial state when said board is plugged into a connector having a plurality of contact fingers and a source of initializing voltage connected to one of said contact fingers, said apparatus comprising:

a contact mounted on said board, said contact slidably engaging said one finger when said board is partially inserted into said connector and said contact sliding past said one finger and breaking contact with said finger when said board is fully inserted into said connector; and means connected to said contact and responsive to a momentary application of said initializing voltage for placing said circuitry into an initial state.

4. Apparatus for initializing circuitry according to claim 3 wherein said means for placing said circuitry into an initial state comprises a bistable device having two states, said device being responsive to said momentary application of said voltage for entering into one of said two states.

5. Apparatus for initializing circuitry according to claim 4 further comprising means connected to said bistable device for placing said device into the second state of said two states to reset said circuitry.

6. In a telephone circuit mounted on a plug-in circuit board which may be unplugged from and replaced in a frame connector having a plurality of contact fingers, a source of potential and a busy/idle control lead connected to respective ones of said fingers, said circuit having a lockout relay responsive to signals on said control lead for controlling the busy/idle status of said circuit, the improvement comprising a contact mounted on said board, said contact slidably engaging the one of said plurality of fingers connected to said potential source when said board is partially inserted into said connector and said contact sliding past said one finger connected to said potential source and breaking contact with said one finger when said board is fully inserted into said connector and means connecting said contact to said relay so that said relay is operated in response to said board being inserted into said connector.

7. In a telephone circuit according to claim 6 the improvement further comprising means controlled by said relay for signaling that said circuit is busy and means for activating said signaling means when said board is removed from said connector.

8. In a telephone circuit according to claim 7, the improvement further comprising means responsive to the operation of said relay for holding said relay operated and means responsive to the operation of said relay for visually indicating that said relay is operated.

9. In a telephone circuit according to claim 7, the improvement wherein said signaling means comprises a busy/idle status lead connected to said connector and a contact controlled by said relay to connect said status lead to a source of potential, and wherein said activating means comprises two contact fingers in said connector, said fingers mechanically moving to make electrical contact when said board is removed from said connector and moving to break electrical contact when said board is plugged into said connector, means for connecting one of said two fingers to a source of potential and means for connecting the other of said two fingers to said status lead.

10. Apparatus for maintaining a busy/idle status of a plug-in telephone circuit, which circuit must be unplugged and replaced for maintenance purposes from a connector having a source of power, a source of ground potential and a busy/idle control lead thereon, said apparatus comprising:

first means for connecting to said control lead when said telephone circuit is pushed into said connector;

means connected to said first means for making temporary contact with said source of ground potential as said telephone circuit is initially inserted into said connector and for breaking contact with said ground potential source as said telephone circuit is pushed fully into said connector;

second means for connecting to said ground potential source when said telephone circuit is pushed into said connector;

a relay having a winding connected to a source of power and a normally open contact, the operated/released state of said relay being respectively indicative of the busy/idle status of said telephone circuit; and means connecting said winding to said first means and through said contact to said second means.

* * * * *

UNITED STATES PATENT AND TRADEMARK OFFICE
CERTIFICATE OF CORRECTION

PATENT NO. : 4,017,696
DATED : April 12, 1977
INVENTOR(S) : Robert J. Falk

It is certified that error appears in the above-identified patent and that said Letters Patent are hereby corrected as shown below:

In the Drawing, FIG. 2, the reference designation "4" should read --8--; "4A" should read --8A--; "9" should read --17--; and "9A" should read --17A--.

FIG. 3 of the drawings and the drawing figure which appears on the title page should appear as follows:

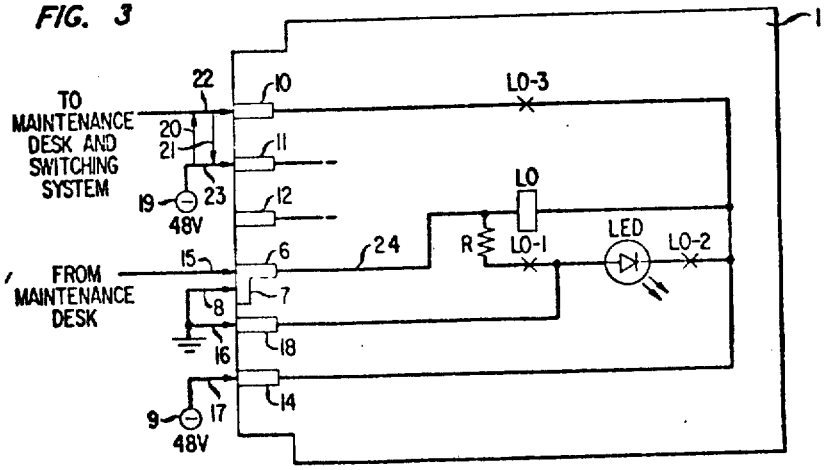

Signed and Sealed this

Seventeenth Day of July 1979

[SEAL]

Attest:

LUTRELLE F. PARKER

*Attesting Officer*  *Acting Commissioner of Patents and Trademarks*